United States Patent
Michizoe et al.

(10) Patent No.: US 10,912,240 B2
(45) Date of Patent: Feb. 2, 2021

(54) SETUP SUPPORTING DEVICE, COMPONENT MOUNTER, SETUP SUPPORTING METHOD

(71) Applicant: YAMAHA HATSUDOKI KABUSHIKI KAISHA, Shizuoka (JP)

(72) Inventors: Toshihiro Michizoe, Shizuoka (JP); Naoki Hanamura, Shizuoka (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 43 days.

(21) Appl. No.: 15/554,962

(22) PCT Filed: Apr. 3, 2015

(86) PCT No.: PCT/JP2015/060574
§ 371 (c)(1),
(2) Date: Aug. 31, 2017

(87) PCT Pub. No.: WO2016/157515
PCT Pub. Date: Oct. 6, 2016

(65) Prior Publication Data
US 2018/0049353 A1    Feb. 15, 2018

(51) Int. Cl.
*H05K 13/08*    (2006.01)
*H05K 13/04*    (2006.01)

(52) U.S. Cl.
CPC ..... *H05K 13/0417* (2013.01); *H05K 13/0419* (2018.08)

(58) Field of Classification Search
CPC .......... H05K 13/0417; H05K 13/0419; H05K 13/086; H05K 13/0408; H05K 13/08
(Continued)

(56) References Cited

U.S. PATENT DOCUMENTS 6,332,536 B2 * 12/2001 Easton ............... H05K 13/0417
206/459.5
2003/0219330 A1 * 11/2003 Lyndaker ........... H05K 13/0419
414/411
(Continued)

FOREIGN PATENT DOCUMENTS

CN    104170540 A    11/2014
JP    H10-065399 A    3/1998
(Continued)

OTHER PUBLICATIONS

International Search Report issued in PCT/JP2015/060574; dated Jul. 7, 2015.
An Office Action issued by the State Intellectual Property Office dated May 8, 2019, which corresponds to Chinese Patent Application No. 201580074374.0 and is related to U.S. Appl. No. 15/554,962; with English Translation.

*Primary Examiner* — Michael J Brown
(74) *Attorney, Agent, or Firm* — Studebaker & Brackett PC (57) ABSTRACT

When an operator performs a tape inserting operation of inserting a tape into an insertion port for a tape feeder, the tape feeder detects the tape inserted into the insertion port. Further, it is confirmed based on operation object information indicating the tape feeder serving as an object of the tape inserting operation that the tape feeder having detected the tape is the object of the tape inserting operation. If the tape feeder is the object of the tape inserting operation, the tape feeder is caused to perform loading or standby. In this way, after it is confirmed that the tape feeder, for which the tape inserting operation was performed by the operator, is the object of this operation, the tape feeder is caused to perform the loading or the standby and a problem of erroneous insertion of the tape into the tape feeder can be dealt with.

8 Claims, 6 Drawing Sheets

(58) Field of Classification Search
USPC .......................................................... 700/121
See application file for complete search history.

(56) References Cited

U.S. PATENT DOCUMENTS

| | | | | |
|---|---|---|---|---|
| 2009/0229117 | A1* | 9/2009 | Saho | H05K 13/0417 29/739 |
| 2014/0230241 | A1* | 8/2014 | Yamasaki | H05K 13/086 29/739 |
| 2014/0262051 | A1* | 9/2014 | Youngquist | B23K 1/0016 156/701 |
| 2015/0110588 | A1* | 4/2015 | Ohyama | H05K 13/0419 414/411 |
| 2015/0212519 | A1* | 7/2015 | Sumi | H05K 13/0417 700/115 |
| 2018/0042151 | A1* | 2/2018 | Ohashi | H05K 13/003 |

FOREIGN PATENT DOCUMENTS

| | | | | |
|---|---|---|---|---|
| JP | 2005-203655 A | 7/2005 | | |
| JP | 2011-077096 A | 4/2011 | | |
| JP | 2011-108909 A | 6/2011 | | |
| JP | 2014-011291 A | 1/2014 | | |
| JP | 2014-027130 A | 2/2014 | | |
| JP | 2014-077096 A | 5/2014 | | |
| JP | 2014-236126 A | 12/2014 | | |
| JP | 2015-141909 A | 8/2015 | | |
| JP | 2015-141910 A | 8/2015 | | |
| WO | WO-2015063880 A1 * | 5/2015 | ............. | H05K 13/08 |
| WO | WO-2016002085 A1 * | 1/2016 | ............. | H05K 13/02 |

* cited by examiner

| | STATE | SENSOR | | | | DRAWING ROLLER 52 | | SUPPLY SPROCKET 57 |
|---|---|---|---|---|---|---|---|---|
| | | I1 | I2 | O1 | O2 | ON/OFF | ROTATING DIRECTION | ON/OFF |
| 1 | TAPE IS NOT INSERTED INTO BOTH TAPE INSERTION PATHS P1, P2 | × | × | × | × | OFF | — | OFF |
| 2 | INSERT TAPE INTO TAPE INSERTION PATH P1 | ○ | × | × | × | ON | D1 | OFF |
| 3 | TAPE SHORTAGE SENSOR O1 IS SWITCHED ON | ○ | × | ○ | × | ON | D1 | OFF |
| 4 | ELAPSE OF TIME T1 | ○ | × | ○ | × | ON | D1 | ON |
| 5 | ELAPSE OF TIME T2 | ○ | × | ○ | × | OFF | — | ON |
| 6 | INSERT TAPE INTO TAPE INSERTION PATH P2 | ○ | ○ | ○ | ○ | ON | D2 | ON |
| 7 | TAPE SHORTAGE SENSOR O2 IS SWITCHED ON | ○ | ○ | ○ | ○ | OFF | — | ON |
| 8 | TAPE SHORTAGE SENSOR O1 IS SWITCHED OFF | × | ○ | × | ○ | ON | D2 | ON |
| 9 | ELAPSE OF TIME T3 | × | ○ | × | ○ | ON | — | ON |
| 10 | INSERT TAPE INTO TAPE INSERTION PATH P1 | ○ | ○ | ○ | ○ | ON | D1 | ON |
| 11 | TAPE SHORTAGE SENSOR O1 IS SWITCHED ON | ○ | × | ○ | ○ | OFF | — | ON |
| 12 | TAPE SHORTAGE SENSOR O2 IS SWITCHED OFF | ○ | × | ○ | × | ON | D1 | ON |
| 13 | ELAPSE OF TIME T4 | ○ | × | ○ | × | OFF | — | ON |

SETUP SUPPORTING DEVICE, COMPONENT MOUNTER, SETUP SUPPORTING METHOD

CROSS REFERENCE TO RELATED APPLICATIONS

This application claims benefit of priority to International Patent Application No. PCT/JP2015/060574 filed Apr. 3, 2015, the entire content of which is incorporated herein by reference.

TECHNICAL FIELD

This disclosure relates to a technique for supporting a setup operation of attaching tape housing components into a feeder.

BACKGROUND

Conventionally, in a component mounter for mounting components on a board by a mounting head, a feeder is widely used which successively supplies components to the mounting head by feeding tape housing components. Such a feeder is configured so that a setup operation of attaching a new tape can be appropriately performed according to a component shortage or the like. For example, a feeder described in JP2014-077096 includes a supply tape inserting part into which a tape is to be inserted and has a suction position where components are supplied to a mounting head. When an operator inserts the tape into the supply tape inserting part, a sprocket provided in the feeder feeds the tape from the tape inserting part to the suction position. In this way, the new tape is attached in the feeder.

A plurality of feeders are used in a component mounter. Thus, erroneous insertion of inserting a tape into a wrong feeder possibly occurs in a setup operation. Accordingly, in JP2014-077096, gates are provided to open and close the supply tape inserting parts, and the occurrence of erroneous insertion is suppressed by opening the gate for the feeder, which is an insertion object of the tape, and closing the gate for the feeder, which is not the insertion object of the tape.

SUMMARY

Technical Problem

However, since the feeder needs to be provided with the gate in JP2014-077096, the mechanical configuration of the feeder is complicated. Further, with such complication of the configuration, it is also supposed that a gate opening/closing mechanism breaks down. If the gate opening/closing mechanism breaks down, the occurrence of erroneous insertion cannot be effectively suppressed. Thus, the technique of JP2014-077096 cannot be necessarily said to be effective.

This disclosure was developed in view of the above problem and aims to provide a technique capable of dealing with a problem of erroneous insertion of a tape into a feeder.

Solution to Problem

To achieve this aim, the setup supporting device according to the present disclosure, comprises: a storage that stores operation object information indicating a feeder serving as an object of a tape inserting operation of inserting tape housing components out of a plurality of feeders; and a controller that judges whether or not the tape inserting operation performed for the feeder is proper; wherein: the feeder includes a tape inserting part into which the tape is to be inserted, a component supply part to supply the components housed in the tape, a carrier that performs loading to draw the tape inserted into the tape inserting part up to a predetermined position toward the component supply part and a detector that detects the tape inserted into the tape inserting part; and the controller causes one feeder having detected the tape inserted into the tape inserting part, out of the plurality of feeders, to perform the loading or standby to cause the tape to temporarily wait before the loading when confirming based on the operation object information that the one feeder is the object of the tape inserting operation.

To achieve this aim, the component mounter according to the present disclosure, comprises: a storage that stores operation object information indicating a feeder serving as an object of a tape inserting operation of inserting tape housing components out of a plurality of feeders; and a controller that judges whether or not the tape inserting operation performed for the feeder is proper; wherein: the feeder includes a tape inserting part into which the tape is to be inserted, a component supply part to supply the components housed in the tape, a carrier that performs loading to draw the tape inserted into the tape inserting part up to a predetermined position toward the component supply part and a detector that detects the tape inserted into the tape inserting part; and the controller causes one feeder having detected the tape inserted into the tape inserting part, out of the plurality of feeders, to perform the loading or standby to cause the tape to temporarily wait before the loading when confirming based on the operation object information that the one feeder is the object of the tape inserting operation.

To achieve this aim, the setup supporting method of the present disclosure, comprises: a step of confirming a feeder having detected a tape inserted into a tape inserting part out of a plurality of feeders each including the tape inserting part into which the tape housing components is to be inserted and a component supply part to supply the components housed in the tape; and a step of judging based on operation object information indicating the feeder serving as an object of a tape inserting operation of inserting the tape whether or not the tape inserting operation performed for the feeder is proper; wherein one feeder having detected the tape inserted into the tape inserting part, out of the plurality of feeders, is caused to perform loading or standby to cause the tape to temporarily wait before the loading when confirming based on the operation object information that the one feeder is the object of the tape inserting operation.

In the disclosure (setup supporting device, component mounter, setup supporting method) thus configured, when the operator performs the tape inserting operation of inserting the tape into the tape inserting part for one feeder, this one feeder detects the tape inserted into the tape inserting part. Further, it is confirmed based on the operation object information indicating the feeder serving as the object of the tape inserting operation that the one feeder having detected the tape is the object of the tape inserting operation. If the one feeder could be confirmed to be the object of the tape inserting operation, the one feeder is caused to perform the loading or the standby to cause the tape to temporarily wait before the loading. In this way, the one feeder is caused to perform the loading or the standby after it is confirmed that the one feeder, for which the tape inserting operation was performed by the operator, is the object of the tape inserting operation, wherefore a problem of erroneous insertion of the tape into the feeder can be dealt with.

Note that the predetermined position serving as a drawing destination in the loading may be a position closer to the component supply part than the tape inserting part. Thus, if the side of the tape inserting part is a rear side and the side of the component supply part is a front side, this predetermined position can be, for example, a position before the component supply part, a position at the component supply part or a position behind the component supply part.

Advantageous Effects of Disclosure

According to the disclosure, a problem of erroneous insertion of the tape into the feeder can be dealt with.

DETAILED DESCRIPTION

Figure 1:
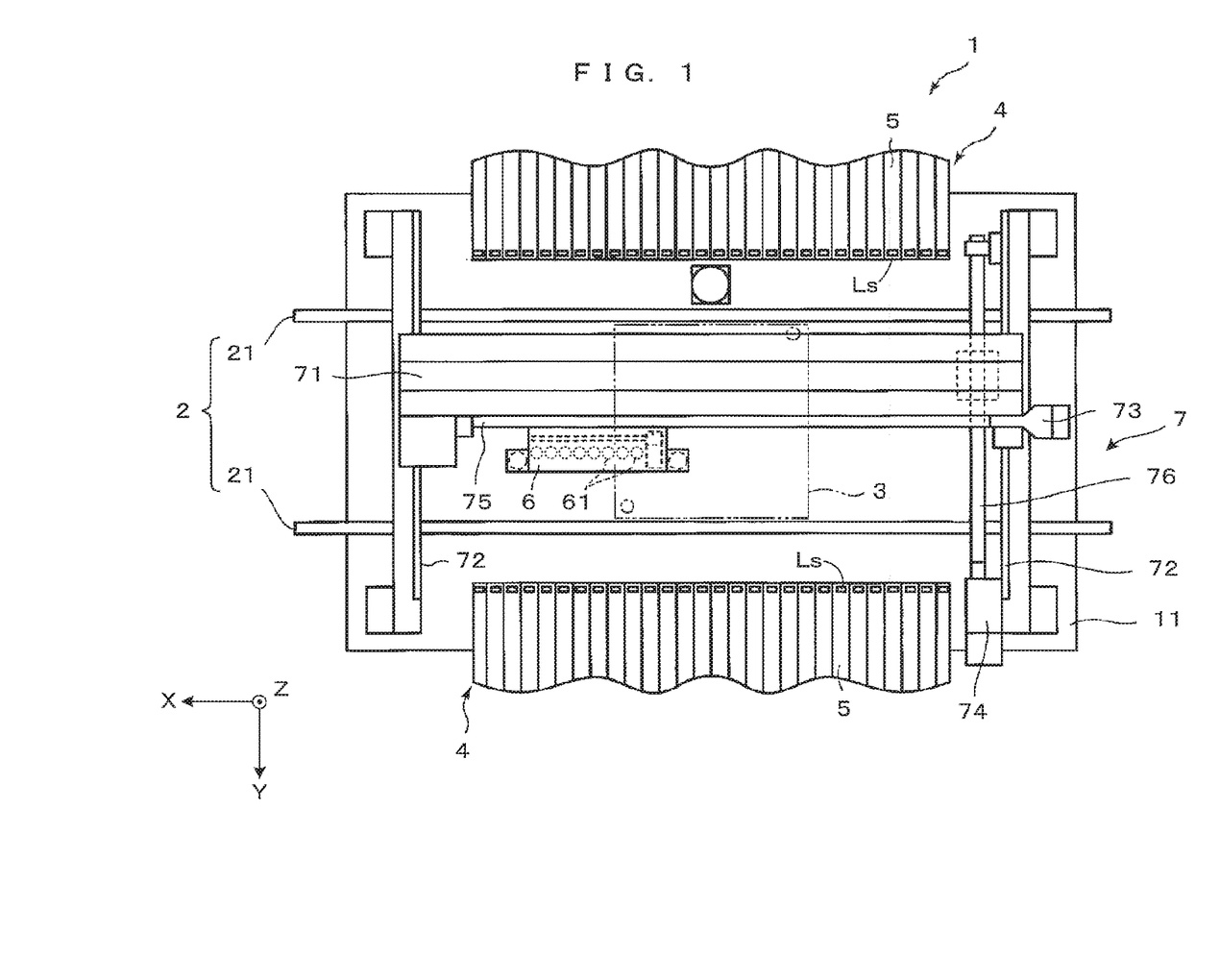
FIG. 1 is a plan view schematically showing an example of the configuration of a component mounter.

FIG. 1 is a plan view schematically showing an example of the configuration of a component mounter. Note that XYZ orthogonal coordinate axes with a vertical direction as a Z-axis direction are shown in FIG. 1. In the component mounter 1, a board conveying mechanism 2 is arranged on a base 11, and a board 3 can be conveyed in a predetermined X-axis direction (conveying direction). More specifically, the board conveying mechanism 2 includes a pair of conveyors 21, 21 for conveying the board 3 from right to left of FIG. 1 above the base 11. The conveyors 21, 21 stop the board 3 carried in at a predetermined mounting operation position (position of the board 3 shown in FIG. 1). The board 3 conveyed in this way is fixed and held by an unillustrated holding device. Subsequently, an electronic component (not shown) supplied from a tape feeder 5 of a component housing unit 4 is transferred to the board 3 fixed and held at the mounting operation position by a head unit 6. When the head unit 6 reciprocates between positions above the component housing units 4 and positions above the board 3 a plurality of times and completes a mounting process for all components to be mounted on the board 3 in this way, the board conveying mechanism 2 carries out the board 3.

The component housing units 4 described above are arranged at both sides of the board conveying mechanism 2. Each of these component housing units 4 is configured such that a multitude of tape feeders 5 are arranged in the X-axis direction. Further, a reel (not shown) having the tape housing and holding electronic components wound thereon is arranged for each tape feeder 5, and the tape pulled out from the reel is attached to the tape feeder 5. The tape feeder 5 intermittently supplies the electronic components in the tape to a component supply position Ls by advancing the attached tape toward the component supply position Ls provided on a leading end part on the side of the head unit 6. In this way, the head unit 6 can pick up the component at the component supply position Ls using a suction nozzle 61. Note that the tape feeder 5 is described in detail later.

Further, in this embodiment, a head driving mechanism 7 is provided besides the board conveying mechanism 2. This head driving mechanism 7 is a mechanism for moving the head unit 6 in the X-axis direction and a Y-axis direction (direction perpendicular to the X- and Z-axis directions) in a predetermined range of the base 11. The electronic component sucked by the suction nozzle 61 is conveyed from the position above component housing unit 4 to the position above the board 3 by a movement of the head unit 6. Specifically, the head driving mechanism 7 includes a head supporting member 71 extending in the X-axis direction and this head supporting member 71 supports the head unit 6 movably along the X-axis direction. Both end of the head supporting member 71 are supported on fixed rails 72 extending in the Y-axis direction located above the board conveying mechanism 2, and the head supporting member 71 is movable in the Y-axis direction along these fixed rails 72. Further, the head driving mechanism 7 includes an X-axis servo motor 73 serving as a drive source for driving the head unit 6 in the X-axis direction and a Y-axis servo motor 74 serving as a drive source for driving the head unit 6 in the Y-axis direction. The motor 73 is coupled to a ball screw 75, and the head unit 6 is driven in the X-axis direction via the ball screw 75 by the operation of the motor 73. On the other hand, the motor 74 is coupled to a ball screw 76, and the head supporting member 71 is driven in the Y-axis direction via the ball screw 76 by the operation of the motor 74.

By the head driving mechanism 7, the head unit 6 is caused to convey the electronic component to the board 3 while sucking and holding the electronic component by the suction nozzle and transfers the electronic component to a mounting section. Specifically, in this head unit 6, eight unillustrated mounting heads extending in the Z-axis direction and vertically movable are arranged at equal intervals in the X-axis direction. The suction nozzle 61 is attached at a tip part of each mounting head. The head unit 6 is moved to the position above the component housing unit 4 by the head driving mechanism 7 and the tip part of the suction nozzle 61 comes into contact with the electronic component supplied from the component housing unit 4 while being held in a proper posture, and sucks and holds this electronic component. On this occasion, the suction nozzle 61 sucks the electronic component and ascends after descending to this electronic component. The head unit 6 is conveyed to the position above the board 3 with the electronic component sucked and held by the suction nozzle 61 in this way, and transfers the electronic component to the mounting section on the board 3.

Figure 2:
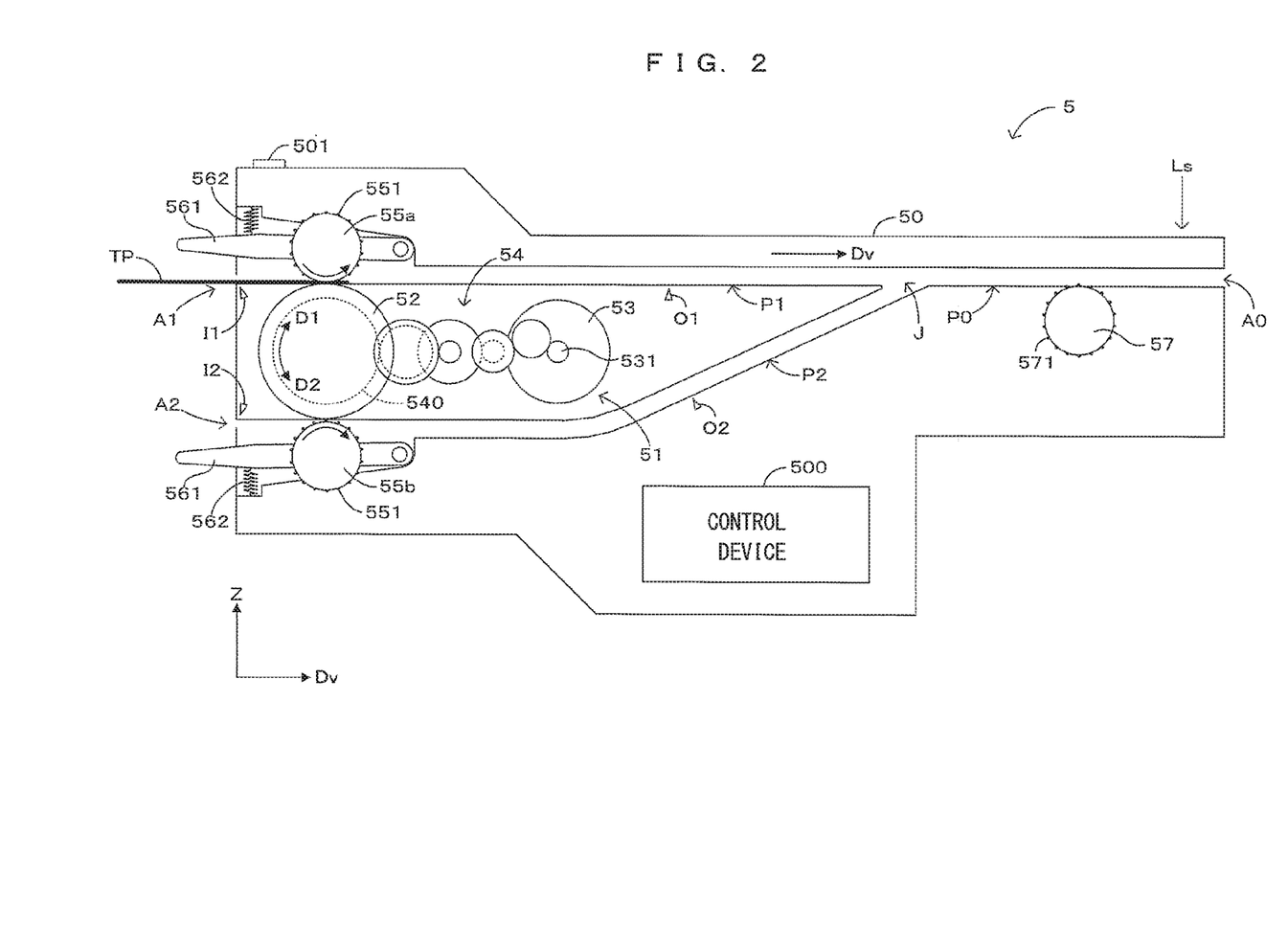
FIG. 2 is a partial side view schematically showing an example of the configuration of the tape feeder.

The above is a summary of the overall configuration of the component mounter 1. Next, the tape feeder 5 is described in detail. FIG. 2 is a partial side view schematically showing an example of the configuration of the tape feeder. In FIG. 2 and subsequent figures, an advance direction Dv of the tape feeder 5 to advance a tape TP and the Z-axis direction are appropriately shown and parts hidden behind other members are appropriately shown in broken lines. Further, an arrow side of the advance direction Dv is referred to as a front side and a side opposite to the arrow of the advance direction Dv is referred to as a rear side. Furthermore, rotating directions of a member are indicated, appropriately using expressions "clockwise" and "counterclockwise" in a side view to be referred to below.

The tape feeder 5 includes a feeder body 50 long in the Y-axis direction. Two tape insertion paths P1, P2 into which the tape TP is insertable are provided in the advance direction Dv in the feeder body 50. That is, two insertion ports A1, A2 are vertically spaced apart in the Z-axis direction on the rear end of the feeder body 50 in the advance direction Dv. The tape insertion path P1 extends straight from the insertion port A1 to a junction point J in front of the insertion port A1 in the advance direction Dv, and the tape insertion path P2 extends from the insertion port A2 to the junction point J while being bent upwardly at an intermediate position. The respective tape insertion paths P1, P2 become a tape supply path P0 after joining at the junction point J, and the tape supply path P0 extends straight in the advance direction Dv and reaches a discharge port A0 provided on the front end of the feeder body 50 in the advance direction Dv.

An operator can insert the tape TP into the feeder body 50 along the tape insertion path P1, P2 from the insertion port A1, A2 of the tape feeder 5 mounted in the component mounter 1. On the other hand, a tape drawing mechanism 51 is arranged near the insertion ports A1, A2 in the feeder body 50, and the tape TP inserted into the tape insertion path P1, P2 is drawn into the feeder body 50 toward the component supply position Ls by the tape drawing mechanism 51.

This tape drawing mechanism 51 includes a drawing roller 52 having a smooth circumferential surface, a single drawing motor 53 provided in front of the drawing roller 52 in the advance direction Dv and a reducer 54 for transmitting a drive force generated by the drawing motor 53 to the drawing roller 52 while reducing the drive force. The reducer 54 includes a driven gear 540 provided coaxially with the drawing roller 52 and integrated with (i.e. integrally rotate with) the drawing roller 52, and the drive force of the drawing motor 53 is transmitted to the driven gear 540 by connecting an output shaft 531 of the drawing motor 53 and the driven gear 540 by a gear train.

Further, the tape drawing mechanism 51 includes a one-way sprocket 55a facing the drawing roller 52 across the tape insertion path P1 from above and a one-way sprocket 55b facing the drawing roller 52 across the tape insertion path P2 from below. A one-way clutch (not shown) rotatable only counterclockwise in FIG. 2, but unrotatable clockwise is mounted on a rotary shaft of the one-way sprocket 55a. Thus, the one-way sprocket 55a is rotatable only counterclockwise, but unrotatable clockwise. On the other hand, a one-way clutch (not shown) rotatable only clockwise, but unrotatable counterclockwise is mounted on a rotary shaft of the one-way sprocket 55b. Thus, the one-way sprocket 55b is rotatable only clockwise, but unrotatable counterclockwise.

A plurality of projections 551 are arranged in a circumferential direction on the peripheral surface of each one-way sprocket 55a, 55b. These projections 551 are provided at the same pitch as an arrangement pitch of a plurality of holes provided in the tape TP, and can be engaged with the holes of the tape TP inserted into the tape insertion path P1, P2. Note that a height of the projections 551 is slightly smaller than a depth of the holes of the tape TP, and the tips of the projections do not come out from the holes of the tape TP when the projections 551 engaged with the holes of the tape TP.

Further, the tape drawing mechanism 51 includes a lever 561 and a biasing member 562 (elastic member such as a spring) for each of the one-way sprockets 55a, 55b. One end of the lever 561 is pivotably supported on the feeder body 50, and the other end of the lever 561 is mounted on the feeder body 50 via the biasing member 562. In this way, a central part (i.e. part between the one and the other ends) of the lever 561 is biased toward the drawing roller 52. Each one-way sprocket 55a, 55b is mounted in the central part of the corresponding lever 561 and biased toward the drawing roller 52.

The tape drawing mechanism 51 thus configured sandwiches the tape TP inserted along the tape insertion path P1 through the insertion port A1 between the peripheral surface of the one-way sprocket 55a and the peripheral surface of the drawing roller 52. This one-way sprocket 55a presses the tape TP in the tape insertion path P1 into contact with (i.e. against) the peripheral surface of the drawing roller 52 by a biasing force of the biasing member 562. In this way, a frictional force is generated between this tape TP and the peripheral surface of the drawing roller 52. Thus, when the drawing roller 52 rotates in a forward direction D1 (clockwise) upon receiving a drive force of the drawing motor 53 rotating in a positive direction, the tape TP in the tape insertion path P1 is drawn into the feeder body 50 in the advance direction Dv by the frictional force between the tape TP and the peripheral surface of the drawing roller 52. At this time, the one-way sprocket 55a rotates counterclockwise, following the drawing roller 52. Specifically, the one-way sprocket 55a rotates, following the drawing roller 52 rotating in the forward direction D1 due to a frictional force with the tape TP drawn into the feeder body 50 in the advance direction Dv and a force acting on the projections 551 successively engaged with the plurality of holes provided in the tape TP, thereby allowing the tape TP inserted into the tape insertion path P1 to be drawn in the advance direction Dv according to the frictional force between the tape TP and the peripheral surface of the drawing roller 52.

On the other hand, the tape driving mechanism 51 sandwiches the tape TP inserted along the tape insertion path P2 through the insertion port A2 between the peripheral surface of the one-way sprocket 55b and the peripheral surface of the drawing roller 52. This one-way sprocket 55b presses the tape TP in the tape insertion path P2 into contact with the peripheral surface of the drawing roller 52 by a biasing force of the biasing member 562. In this way, a frictional force is generated between this tape TP and the peripheral surface of the drawing roller 52. Thus, when the drawing roller 52 rotates in a reverse direction D2 (counterclockwise) upon receiving a drive force of the drawing motor 53 rotating in a negative direction (opposite to the above positive direction), the tape TP in the tape insertion path P2 is drawn into the feeder body 50 in the advance direction Dv by the frictional force between the tape TP and the peripheral surface of the drawing roller 52. At this time, the one-way sprocket 55b rotates clockwise, following the drawing roller 52 due to the frictional force with the tape TP drawn into the feeder body 50 in the advance direction Dv and a force acting on the projections 551 successively engaged with the plurality of holes provided in the tape TP. Specifically, the one-way sprocket 55b rotates, following the drawing roller 52 rotating in the reverse direction D2, thereby allowing the tape TP inserted into the tape insertion path P2 to be drawn in the advance direction Dv according to the frictional force between the tape TP and the peripheral surface of the drawing roller 52.

It is also possible that the tape TP is present in the tape insertion path P2 when the drawing roller 52 rotates in the forward direction D1 to draw the tape TP in the tape insertion path P1. In such a case, it is preferable to be able to suppress a movement of the tape TP in the tape insertion path P2 in a direction opposite to the advance direction according to the frictional force between the tape TP and the drawing roller 52. Accordingly, the one-way sprocket 55b is configured to be unrotatable counterclockwise as described above. That is, while the drawing roller 52 is rotating in the forward direction D1, the one-way sprocket 55b is engaged with the holes of the tape TP inserted into the tape insertion path P2 via the projections 551 and supports this tape TP against the frictional force acting between the tape TP and the drawing roller 52. In this way, the one-way sprocket 55b can restrict a movement of the tape TP in the tape insertion path P2 in the direction opposite to the advance direction Dv according to the frictional force between the tape TP and the drawing roller 52 rotating in the forward direction D1.

For the same reason, the one-way sprocket 55a is configured to be unrotatable clockwise as described above. That is, while the drawing roller 52 is rotating in the reverse direction D2, the one-way sprocket 55 is engaged with the holes of the tape TP inserted into the tape insertion path P1 via the projections 551 and supports this tape TP against the frictional force acting between the tape TP and the drawing roller 52. In this way, the one-way sprocket 55a can restrict a movement of the tape TP in the tape insertion path P1 in the direction opposite to the advance direction Dv according to the frictional force between the tape TP and the drawing roller 52 rotating in the reverse direction D2.

The tape TP drawn along the tape insertion path P1, P2 passes through the junction point J from the tape insertion path P1, P2 and reaches the tape supply path P0. On the other hand, a supply sprocket 57 is arranged to face the tape supply path P0 in the feeder body 50. A plurality of projections 571 are arranged in a circumferential direction on the peripheral surface of this supply sprocket 57. These projections 571 are provided at the same pitch as the arrangement pitch of the plurality of holes provided in the tape TP. Thus, the projections 571 of the supply sprocket 57 are engaged with the holes of the tape TP moving ahead in the tape supply path P0 and reaching the supply sprocket 57. The supply sprocket 57 advances the tape TP in the advance direction Dv by being rotated clockwise by a supply motor (not shown) built in the feeder body 50. In this way, the tape TP is discharged to the outside of the feeder body 50 through the discharge port A0 after passing through the component supply position Ls, and discarded into a waste box (not shown) arranged below the discharge port A0.

The tape TP includes a carrier tape and a cover tape attached to the carrier tape. The carrier tape includes recesses open upward at regular intervals, and components are housed in the respective recesses. Holes to be engaged with each of the sprockets 55a, 55b and 57 described above are provided side by side in a longitudinal direction (advance direction Dv) on one side in a width direction of the carrier tape. On the other hand, the cover tape is bonded to the upper surface of the carrier tape on both sides in the width direction to continuously cover openings of the carrier tape. In this way, the components housed in the tape TP are held in the recesses of the carrier tape while being covered by the cover tape.

Accordingly, for the suction nozzle 61 to pick up the component at the component supply position Ls, the component housed in the tape TP needs to be exposed before reaching the component supply position Ls. Various known methods can be used as a method for exposing the components. Specifically, the components may be exposed by peeling and turning up the other side of the cover tape in the width direction from the carrier tape along the advance direction Dv with one side of the cover tape in the width direction bonded to the carrier tape. Alternatively, the components may be exposed by cutting a widthwise center of the cover tape along the advance direction Dv and turning up both sides of the cut. In the case of employing these methods, after the component is picked up at the component supply position Ls, the cover tape is discharged from the discharge port A0 together with the carrier tape and discarded into the waste box.

Further, a control device 500 and various sensors I1, I2, O2 and O2 are provided in the feeder body 50 to control each part of the tape feeder 5. The control device 500 is a computer including a CPU (Central Processing Unit) and a memory, and integrally controls the operation of each part constituting the tape feeder 5. The tape insertion sensor I1 is arranged to face the tape insertion path P1 between the insertion port A1 and the drawing roller 52 and detects the presence or absence of the tape TP near the insertion port A1 of the tape insertion path P1. The tape insertion sensor I2 is arranged to face the tape insertion path P2 between the insertion port A2 and the drawing roller 52 and detects the presence or absence of the tape TP near the insertion port A2 of the tape insertion path P2. The tape shortage sensor O1 is arranged to face the tape insertion path P1 between the drawing roller 52 and the junction point J and detects the presence or absence of the tape TP near the junction point J of the tape insertion path P1. The tape shortage sensor O2 is arranged to face the tape insertion path P2 between the drawing roller 52 and the junction point J and detects the presence or absence of the tape TP near the junction point J of the tape insertion path P2. The various sensors I1, I2, O1 and O2 are, for example, optical sensors (photosensors, photoelectric sensors, etc.), output a high-level signal to the control device 500 while detecting the tape TP and output a low-level signal to the control device 500 while detecting no tape TP. The control device 500 controls the advance of the tape TP, for example, as shown in FIG. 3 by controlling the drawing motor 53 and the motor connected to the supply sprocket 57 based on detection results of the various sensors I1, I2, O1 and O2.

Figure 3:
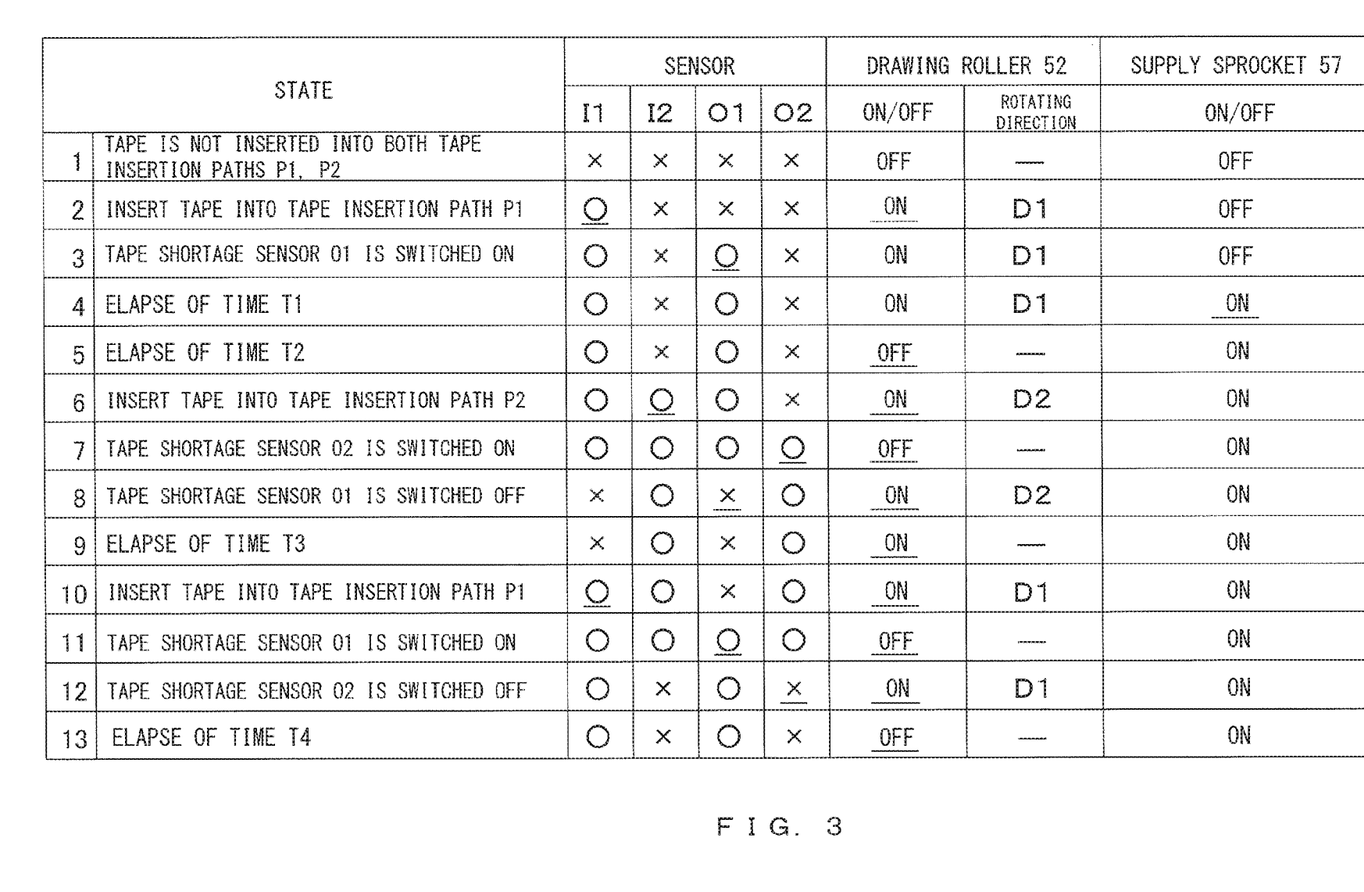
FIG. 3 is a table showing examples of operations performed in the tape feeder.

FIG. 3 is a table showing examples of operations performed in the tape feeder. In FIG. 3, the operations of function sections such as the sensors I1, I2, O1 and O2, the drawing roller 52 and the supply sprocket 57 are shown for each state. Incidentally, in FIG. 3, an underline indicates that the operation of each function section has changed according to a state transition. Further, symbol "○" indicates that an output signal of the corresponding sensor is high level and symbol "x" indicates that an output signal of the corresponding signal is low level.

In FIG. 3, an operation when the tape TP is inserted into the tape insertion path P1 and attached to the tape feeder 5 from a state where the tape TP is not inserted in either one of the tape insertion paths P1, P2 of the tape feeder 5 mounted in the component mounter 1 is shown in relation to states 1 to 5. At first, the tape TP is not inserted in either one of the both tape insertion paths P1, P2, the output signals of the sensors I1, I2, O1 and O2 are all low level and the drawing roller 52 and the supply sprocket 57 are both stopped (off) (state 1). When an operator inserts the tape TP into the tape insertion path P1 from such a state 1, the tape insertion sensor I1 detects the tape TP in the tape insertion path P1 and outputs a high-level signal (state 2).

Further, triggered by the detection of the tape TP by the tape insertion sensor I1, the drawing roller 52 starts rotating in the forward direction D1 (state 2). In this way, the tape TP inserted into the tape insertion path P1 is drawn in the advance direction Dv along the tape insertion path P1. When the leading end of the tape TP reaches a position facing the tape shortage sensor O1, the output signal of the tape shortage sensor O1 changes to high level (state 3). At this time, the drawing roller 52 rotates at a speed faster than a normal speed during the state 2 and, after a transition to the state 3, reduces the rotating speed and rotates at the normal speed.

When the leading end of the tape TP reaches the vicinity of the supply sprocket 57 upon the elapse of a time T1 after a change of the output signal of the tape shortage sensor O1 to high level, the supply sprocket 57 starts rotating clockwise (state 4). When the leading end of the tape TP is engaged with the supply sprocket 57 upon the elapse of a time T2, the rotation of the drawing roller 52 is stopped (state 5).

As just described, in the states 1 to 5, the loading is performed to draw the tape TP inserted into the tape insertion path P1 toward the component supply position Ls up to a position (predetermined position) where the tape TP is engaged with the supply sprocket 57, and the attachment of the tape TP inserted into the tape insertion path P1 to the tape feeder 5 is completed. Note that the tape TP is advanced in the advance direction Dv solely by the supply sprocket 57 after the leading end of the tape TP is engaged with the supply sprocket 57. At this time, the one-way sprocket 55a rotates counterclockwise by being pulled by the supply sprocket 57 via the tape TP and allows the advance of the tape TP in the advance direction Dv by the supply sprocket 57.

Next, in FIG. 3, an operation when the tape TP is inserted into the tape insertion path P2 and attached to the tape feeder 5 from a state where the tape TP is inserted only in the tape insertion path P1 is shown in relation to states 6 to 9. That is, when the operator inserts the tape TP into the tape insertion path P2, the tape insertion sensor I2 detects the tape TP in the tape insertion path P2 and outputs a high-level signal (state 6). Further, triggered by the detection of the tape TP by the tape insertion sensor I2, the drawing roller 52 starts rotating at a fast speed in the reverse direction D2 (state 6). In this way, the tape TP inserted into the tape insertion path P2 is drawn in the advance direction Dv along the tape insertion path P2.

Incidentally, when the drawing roller 52 starts rotating in the reverse direction D2, the tape TP is sandwiched between the one-way sprocket 55a to the tape insertion path P1 and the drawing roller 52. However, since the one-way sprocket 55a supports the tape TP in the tape insertion path P1 against a frictional force between the tape TP and the drawing roller 52 rotating in the reverse direction D2 by the projections engaged with the holes of the tape TP in the tape insertion path P1, this tape TP is advanced in the advance direction Dv by the supply sprocket 57 without moving in a direction opposite to the advance direction Dv.

When the leading end of the tape TP inserted into the tape insertion path P2 reaches the tape shortage sensor O2 and the output signal of the tape shortage sensor O2 changes to high level, the rotation of the drawing roller 52 in the reverse direction D2 is stopped (state 7). In this way, the tape TP inserted into the tape insertion path P2 moves to the tape shortage sensor O2 and comes to rest there. That is, with the leading end of the tape TP located at the position where the tape shortage sensor O2 detects the tape TP, standby is performed to cause the tape TP inserted into the tape insertion path P2 to wait.

When the back end of the tape TP passes through the tape shortage sensor O1 in the tape insertion path P1 and the output signal of the tape shortage sensor O1 changes to low level (in other words, when it is detected that the tape TP first inserted into the tape insertion path P1 will be shortly used up), the drawing roller 52 starts rotating in the reverse direction D2 at the normal speed in synchronization with the feed of the tape in the tape insertion path P1 by the supply sprocket 57 (state 8). In this way, the tape TP waiting in the tape insertion path P2 follows after the tape TP in the tape insertion path P1 moving in the advance direction Dv, thereby being further drawn in the advance direction Dv toward the supply sprocket 57. When the leading end of the tape TP inserted into the tape insertion path P2 is engaged with the projections 571 of the supply sprocket 57 upon the elapse of a time T3, the rotation of the drawing roller 52 is stopped (state 9).

As just described, in the states 6 to 9, the tape TP inserted into the tape insertion path P2 is drawn to and caused to wait at a position where the tape shortage sensor O2 detects the tape TP (standby). The tape TP waiting in the tape insertion path P2 is drawn toward the component supply position Ls up to the position (predetermined position) where the tape TP is engaged with the supply sprocket 57 (loading), in accordance with a timing at which the components of the tape TP first inserted into the tape insertion path P1 are used up. In this way, the attachment of the tape TP inserted into the tape insertion path P2 into the tape feeder 5 is completed.

That is, in the example shown here, the loading is an operation of drawing the leading end of the tape TP to a first position closer to the component supply position Ls than the insertion port A1, A2 and the standby is an operation of drawing the leading end of the tape TP up to a second position which is closer to the insertion port A1, A2 than the junction point J and is between the insertion port A1, A2 and the first position. The operation (loading/standby) to be performed on the tape TP is switched according to the presence or absence of the previously inserted tape TP.

Next, in FIG. 3, an operation when the tape TP is inserted into the tape insertion path P1 and attached to the tape feeder 5 from a state where the tape TP is inserted only in the tape insertion path P2 is shown in relation to states 10 to 13. Such attachment of the tape TP can be performed by performing an operation similar to the one performed for the tape insertion path P2 in the states 6 to 9 for the tape insertion path P1. Thereafter, the tapes TP can be successively attached to the tape feeder 5 by alternately performing a process in the states 6 to 9 and a process in the states 10 to 13.

In the component mounter 1 shown in FIG. 1, a plurality of tape feeders 5 are set in the component housing unit 4. On this occasion, a setup operation of setting up the plurality of tape feeders 5 to the component mounter 1 can be performed at once by mounting the plurality of tape feeders 5 on a carriage 8 (FIGS. 4 and 5) and attaching this carriage 8 to the component housing unit 4 of the component mounter 1. Particularly, in this embodiment, the setup operation using the carriage 8 can be supported by a server PC 9 (FIG. 5).

Figure 4:
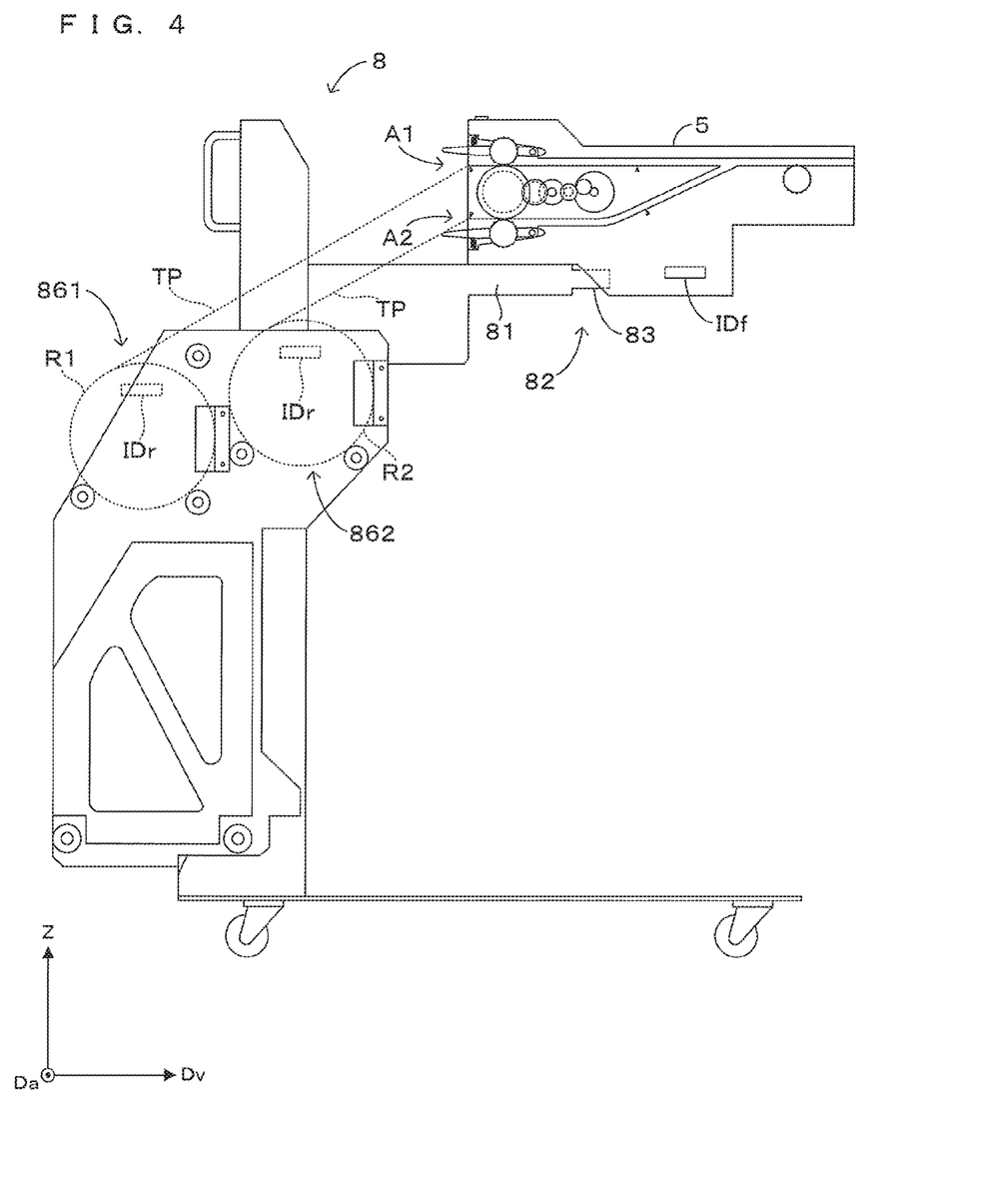
FIG. 4 is a side view schematically showing an example of the configuration of the carriage capable of mounting the plurality of tape feeders.
Figure 5:
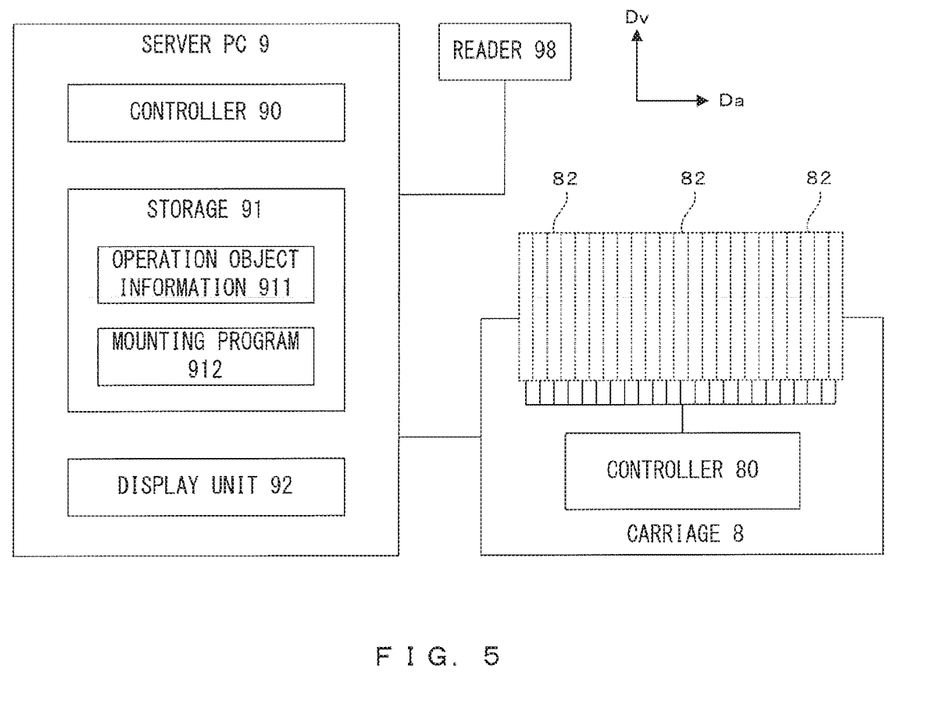
FIG. 5 is a block diagram schematically showing an example of the electrical configuration of the carriage and the server PC for supporting the setup operation.

FIG. 4 is a side view schematically showing an example of the configuration of the carriage capable of mounting the plurality of tape feeders. FIG. 5 is a block diagram schematically showing an example of the electrical configuration of the carriage and the server PC for supporting the setup operation. The carriage 8 has a controller 80 shown in FIG. 5 besides a mechanical configuration shown in FIG. 4. The controller 80 of the carriage 8 is a computer including a CPU (Central Processing Unit), a memory and the like. On the other hand, the server PC 9 includes a controller 90 including a CPU (Central Processing Unit) and a memory, a storage 91 constituted by a hard disk and a display unit 92 constituted by a display. The controller 90 of the server PC 9 integrally performs control operations necessary to support the setup operation while transmitting and receiving information and commands to and from the controller 80 of the carriage 8.

The carriage 8 is configured such that the plurality of tape feeders 5 are mountable to the component housing unit 4 of the component mounter 1 while being supported side by side in an arrangement direction Da. Note that the arrangement direction Da is a direction perpendicular to the advance direction Dv of the tape feeders 5 mounted on the carriage 8 and the Z-axis direction. Specifically, the carriage 8 includes, in a front part, a feeder supporting member 81 for supporting the plurality of tape feeders 5. In the feeder supporting member 81, a plurality of mounting sections 82 are arranged in the arrangement direction Da and the tape feeder 5 can be detachably mounted at each mount position Lf.

A connector 83 detachably mountable into the tape feeder 5 is provided at each mounting section 82 of the feeder supporting member 81. The tape feeder 5 mounted on the mounting section 82 is engaged with the connector 83 of this mounting section 82 to be electrically connected to the carriage 8, and the carriage 8 can supply power and communicate with the tape feeder 5 engaged with the connector 83.

Further, the carriage 8 includes, in a rear part, a first reel holder 861 and a second reel holder 862. The first and second reel holders 861, 862 are arranged behind the mounting sections 82 of the tape feeders 5 while being shifted from each other in a front-rear direction, and the first reel holder 861 is arranged behind the second reel holder 862. The first reel holder 861 can hold a plurality of first reels R1 arranged in the arrangement direction Da, and the second reel holder 862 can hold a plurality of second reels R2 arranged in the arrangement direction Da.

Various arrangement modes of the first and second reels R1, R2 are conceivable. Here, a case is illustrated where the first reel R1 and the second reel R2 are respectively provided for each mounting section 82, the tape TP pulled out from the first reel R1 is inserted into the insertion port A1 of the tape feeder 5 mounted on one mounting section 82, and the tape TP pulled out from the second reel R2 is inserted into the insertion port A2 of the tape feeder 5 mounted on this one mounting section 82.

A barcode IDr is assigned to each of the first and second reels R1, R2, and a component ID (Identification Data) for identifying the type of the components housed in the tape TP held by the corresponding reel R1, R2 is recorded in each barcode IDr. Further, a barcode IDf is assigned to the tape feeder 5, and a feeder ID for individually identifying the tape feeder 5 is recorded in this barcode IDf. The server PC 9 is provided with a reader 98, and supports the setup operation based on reading results of the barcodes IDr, IDf by the reader 98.

Figure 6:
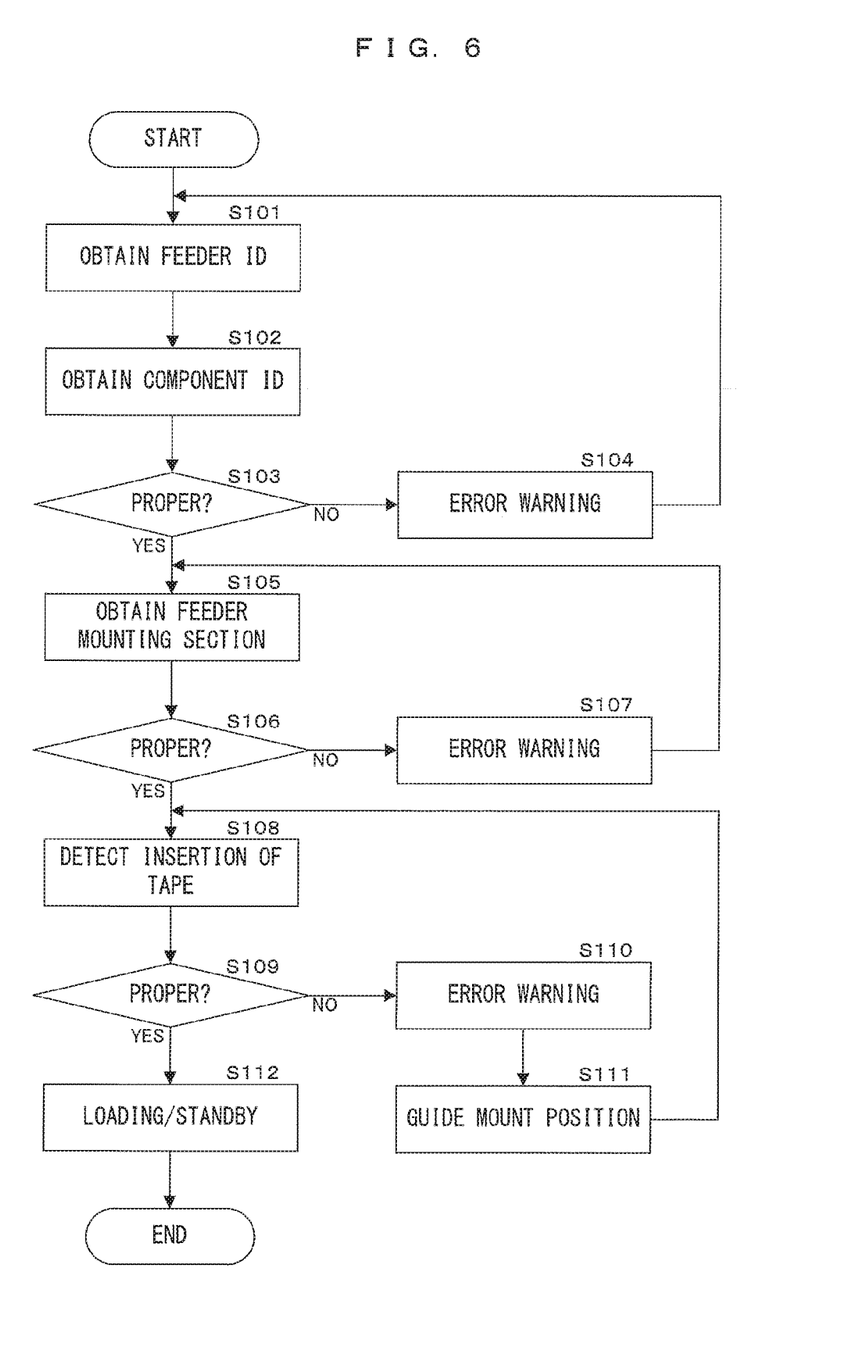
FIG. 6 is a flow chart showing an example of an operation of mounting the tape feeder on the carriage in the setup operation.

FIG. 6 is a flow chart showing an example of an operation of mounting the tape feeder on the carriage in the setup operation. In Step S101, an operator reads the barcode IDf assigned to the tape feeder 5 planned to be mounted on the feeder supporting member 81 of the carriage 81 by the reader 98 and the controller 90 obtains the feeder ID recorded in the barcode IDf from that reading result. Further, the controller 90 registers the obtained feeder ID in operation object information 911 stored in the storage 91. In this way, the controller 90 recognizes that the tape feeder 5 corresponding to the feeder ID registered in the operation object information 911 is an operation object of the operator.

In Step S102, the operator reads the barcodes IDr of the reels R1, R2 holding the tapes TP to be inserted into the tape feeder 5 as the operation object using the reader 98 and the controller 90 obtains the component ID recorded in the barcodes IDr from that reading result. Further, the controller 90 registers the obtained component ID in the operation object information 911. In this way, the controller 90 recognizes that the tape TP corresponding to the component ID registered in the operation object information 911 is the operation object of the operator.

Then, in Step S103, the controller 90 judges whether or not a combination of the feeder ID and the component ID registered in the operation object information 911 is proper. That is, a mounting program 912 describing the procedure of mounting the components on the board 3 in the component mounter 1 is stored in the storage 91. A combination of the tape feeder 5 and the components to be supplied by this tape feeder 5 is specified by the mounting program 912. Accordingly, the controller 90 judges whether or not the combination of the feeder ID and the component ID matches the combination specified by the mounting program. If these combinations do not match and the combination of the feeder ID and the component ID is not proper ("NO" in Step S103), the controller 90 displays an error indicating that on the display unit 92 (Step S104). On the other hand, if these combinations match and the combination of the feeder ID and the component ID is proper ("YES" in Step S103), advance is made to Step S105.

In Step S105, when the operator mounts the tape feeder 5 on the mounting section 82, the controller 90 obtains the mounting section 82 serving as a mounting object of the tape feeder 5. That is, as the tape feeder 5 is mounted on the mounting section 82, power can be supplied to the tape feeder 5 via the connector 83. Accordingly, the controller 80 of the carriage 8 detects the mounting section 82, for which it has become possible to supply power, out of the plurality of mounting sections 82, and notifies the controller 90 of the server PC 9.

Then, in Step S106, the controller 90 judges whether or not the obtained mounting section 82 is proper. That is, a combination of the tape feeder 5 to be mounted on each mounting section 82 and the components to be supplied by this tape feeder 5 is specified by the mounting program 912. Thus, the mounting section 82 on which the tape feeder 5 is to be mounted is determined out of the plurality of mounting sections 82 from the combination of the feeder ID and the component ID registered in the operation object information 911. Accordingly, the controller 90 judges whether or not the mounting section 82 corresponding to the combination of the feeder ID and the component ID registered in the operation object information 911 matches the mounting section 82 for which the mounting of the tape feeder 5 was detected. If these do not match and the mounting section 82 on which the tape feeder 5 was mounted is not proper ("NO" in Step S106), the controller 90 displays an error indicating that on the display unit 92 (Step S107). On the other hand, if these match and the mounting section 82 on which the tape feeder 5 was mounted is proper ("YES" in Step S106), advance is made to Step S108.

In Step S108, when the operator performs a tape inserting operation of inserting the tape TP into the insertion port A1, A2 of the tape feeder 5, the controller 90 detects the tape feeder 5 for which the tape inserting operation was performed. Specifically, the controller 80 of the carriage 8 monitors output levels of the tape insertion sensors I1, I2 of each tape feeder 5 supported on the feeder supporting member 81. Then, the controller 80 notifies the mounting section 82 of the tape feeder 5, in which the output levels of the tape insertion sensors I1, I2 have changed from low to high, to the controller 90 of the server PC 9.

Then, in Step S109, the controller 90 judges whether or not the tape feeder 5 for which the tape inserting operation was performed is proper. That is, the tape feeder 5 for which this tape inserting operation should be performed is the tape feeder 5 indicated by the feeder ID registered in the operation object information 911, i.e. the tape feeder 5 mounted on the mounting section 82 obtained in Step S105. Accordingly, the controller 90 judges whether or not the mounting section 82 for which the mounting of the tape feeder 5 was detected in Step S105 and the mounting section 82 on which the tape feeder 5 having detected the insertion of the tape in Step S108 was mounted match. If these do not match and the tape feeder 5 for which the tape inserting operation was performed is not proper, for example, because the tape TP was erroneously inserted into a different tape feeder 5 previously mounted on the feeder supporting member 81 ("NO" in Step S109), the controller 90 displays an error indicating that on the display unit 92 (Step S110) and displays a content guiding a correct tape feeder 5 on the display unit 92 (Step S111). Specifically, in Step S111, it is displayed in the form of a figure, a sentence or the like on the display unit 92 that the tape feeder 5 mounted on the mounting section 82 for which the mounting was detected in Step S105 is correct.

On the other hand, if the mounting section 82 for which the mounting of the tape feeder 5 was detected and the mounting section 82 on which the tape feeder 5 having detected the insertion of the tape was mounted match and the tape feeder 5 for which the tape inserting operation was performed is proper, the controller 90 causes this tape feeder 5 to perform either one of the loading and the standby (Step S112). That is, if another tape TP is not mounted in the tape feeder 5 having detected the insertion of the tape TP before the insertion of this tape TP, this tape feeder 5 is caused to perform the loading. On the other hand, if another tape TP is mounted in the tape feeder 5 having detected the insertion of the tape TP before the insertion of this tape TP, this tape feeder 5 is caused to standby. If the loading or the standby is performed in Step S112, the flow chart of FIG. 6 is finished.

As described above, in this embodiment, when the operator performs the tape inserting operation of inserting the tape TP into the insertion port A1, A2 for the tape feeder 5, this tape feeder 5 detects the tape TP inserted into the insertion port A1, A2. Further, it is confirmed based on the operation object information 911 indicating the tape feeder 5 serving as an object of the tape inserting operation that the tape feeder 5 having detected the tape TP is the object of the tape inserting operation. If the tape feeder 5 could be confirmed to be the object of the tape inserting operation, the tape feeder 5 is caused to perform the loading or the standby. In this way, after it is confirmed that the tape feeder 5, for which the tape inserting operation was performed by the operator, is the object of this operation, the tape feeder 5 is caused to perform the loading or the standby and a problem of erroneous insertion of the tape TP into the tape feeder 5 can be dealt with.

Conversely, if it is confirmed based on the operation object information 911 that the tape feeder 5 is not the object of the tape inserting operation, the tape feeder 5 is not caused to perform the loading or the standby. This prevents the loading and the standby from being performed for the erroneously inserted tape TP.

Further, if it is confirmed based on the operation object information 911 that the tape feeder 5 is not the object of the tape inserting operation, a warning is notified to the operator (Step S110). This enables the operator to notice that the tape TP was inserted into the wrong tape feeder 5.

Further, if it is confirmed based on the operation object information 911 that the tape feeder 5 is not the object of the tape inserting operation, the tape feeder 5 serving as the object of the tape inserting operation indicated by the operation object information 911 is notified to the operator (Step S111). This enables the operator to easily grasp the tape feeder 5 into which the tape TP should be inserted.

Furthermore, in this embodiment, a further condition is imposed besides the condition that the tape feeder 5 could be confirmed to be the object of the tape inserting operation in causing the tape feeder 5 to perform the loading or the standby.

That is, a condition that the combination of the tape TP inserted into the tape feeder 5 and the tape feeder 5 is proper is further imposed. In such a configuration, it is required in causing the tape feeder 5 to perform the loading or the standby not only that the tape feeder 5 having detected the tape TP is the object of the tape inserting operation, but also that the combination of the tape TP and the tape feeder 5 is proper. Thus, the tape TP in a proper combination with the tape feeder 5 can be attached to the tape feeder 5.

On this occasion, if it is confirmed that the combination of the tape TP inserted into the tape feeder 5 and the tape feeder 5 is not proper, a warning is notified to the operator (Step S104). This enables the operator to notice that the tape TP in a wrong combination was inserted into the tape feeder 5.

A condition that the mounting section 82 for the tape feeder 5 with respect to the feeder supporting member 81 is proper is further imposed. In such a configuration, it is required in causing the tape feeder 5 to perform the loading or the standby not only that the tape feeder 5 having detected the tape TP is the object of the tape inserting operation, but also that the mounting section 82 for the tape feeder 5 with respect to the feeder supporting member 81 is proper. Thus, the tape feeder 5 can be attached to the proper mounting section 82.

At this time, if it is confirmed that the mounting section 82 for the tape feeder 5 with respect to the feeder supporting member 81 is not proper, a warning is notified to the operator (Step S107). This enables the operator to notice that the tape feeder 5 was mounted on the wrong mounting section 82.

As just described, in this embodiment, the server PC 9 corresponds to an example of a "setup supporting device" of the disclosure, the tape feeder 5 corresponds to an example of a "feeder" of the disclosure, the tape TP corresponds to an example of a "tape" of the disclosure, each of tape insertion ports A1,A2 corresponds to an example of a "tape inserting part" of the disclosure, the component supply position Ls corresponds to an example of a "component supply part" of the disclosure, the position where the tape TP is engaged with the supply sprocket 57 corresponds to an example of a "predetermined position" of the disclosure, the tape drawing mechanism 51 corresponds to an example of a "conveyer" of the disclosure, each of tape insertion sensors I1,I2 corresponds to an example of a "detector" of the disclosure, the operation object information 911 corresponds to an example of an "operation object information" of the disclosure, the storage 91 corresponds to an example of a "storage" of the disclosure, the controller 90 corresponds to an example of a "controller" of the disclosure, the reader 98 corresponds to an example of a "reader" of the disclosure, the feeder ID corresponds to an example of a "feeder identification code" of the disclosure, the component ID corresponds to an example of a "component identification code" of the disclosure, the feeder supporting member corresponds to an example of "feeder supporting member" of the disclosure, and the mounting section 82 corresponds to an example of a "mount position" of the disclosure.

Note that the disclosure is not limited to the above embodiment and various changes other than the aforementioned ones can be made without departing from the gist of the disclosure. For example, the functions of the controller 90 and the storage 91 of the server PC 9 may be incorporated in the component mounter 1. In the case of such a configuration, the component mounter 1 corresponds to an example of a "component mounter" of the disclosure.

Further, in the above embodiment, the disclosure is applied in the case of performing the tape inserting operation into the tape feeder 5 with the tape feeder 5 mounted on the carriage 8. However, the disclosure can also be applied in the case of performing the tape inserting operation into the tape feeder 5 with the tape feeder 5 mounted on a member other than the carriage 8, e.g. a member provided in the component housing unit 4 in the component mounter 1 or a member for the setup operation provided separately from the component housing unit 4.

Further, specific operation contents of the loading can be appropriately changed. That is, in the above embodiment, the loading is performed by drawing the tape TP inserted into the tape insertion path P1 to the position (predetermined position) where the tape TP is engaged with the supply sprocket 57. However, the position to which the tape TP is drawn by the loading may be appropriately changed. For example, in the loading, the leading end of the tape TP may be drawn up to the component supply position Ls or may be drawn up to a position before or after the component supply position Ls.

Further, specific operation contents of the standby can be appropriately changed. That is, in the above embodiment, the standby is performed by causing the tape TP to wait with the leading end of the tape TP located at the position where the tape shortage sensor O2 detects the tape TP. However, the position of the leading end of the tape TP in the standby may be appropriately changed. For example, the tape TP may be caused to wait at the position where the leading end part of the tape TP is engaged with the projections 551 of the one-way sprocket 55*a*, 55*b*. Alternatively, as described in JP2014-27130A, the tape TP may be caused to wait at a position where the leading end of the tape TP is in contact with a restricting section of a stopper mechanism in a tape feeder 5 including the stopper mechanism for restricting an advance of a succeeding tape.

That is, the loading is an operation of locating the leading end of the tape TP at the predetermined position, whereas the standby may be an operation of causing the tape TP to wait with the leading end of the tape TP located upstream of (i.e. closer to the insertion port A1, A2 than) this predetermined position in the advance direction Dv.

Further, in the above embodiment, the tape feeder 5 serving as the object of the tape inserting operation is specified based on the reading result of the feeder IC by the reader 98. However, various specific methods to specify the tape feeder 5 serving as the object of the tape inserting operation are conceivable. For example, the tape feeder 5 designated by a user using an input device such as a keyboard or a mouse provided in the server PC 9 can be specified as the object of the tape inserting operation.

Further, the combination of the tape TP and the tape feeder 5 is specified based on the comparison result of the component ID and the feeder ID. However, various specific methods to specify the combination of the tape TP and the tape feeder 5 are conceivable. For example, the combination can also be specified based on a content input by the user using the above input device of the server PC 9.

Further, the tape TP inserted into the insertion port A1, A2 is detected by the tape insertion sensor I1, I2. However, the tape TP inserted into the insertion port A1, A2 may be detected by a switch which is switched on and off according to insertion into the insertion port A1, A2. Alternatively, various specific methods to detect the tape TP inserted into the insertion port A1, A2 are conceivable. For example, the tape TP inserted into the insertion port A1, A2 may be detected based on a torque generated on a rotary member such as the drawing roller 52 or the one-way sprocket 55*a*, 55*b* by being pressed by the tape TP inserted into the insertion port A1, A2.

Further, although the tape feeder 5 with two tape insertion paths P1, P2 is described, the disclosure can be applied also in an operation of setting up a tape feeder 5 with a single tape insertion path.

As the specific embodiment has been illustrated and described above, according to the disclosure, for example, the setup supporting device may be configured so that the controller notifies a warning to an operator when confirming based on the operation object information that the one feeder is not the object of the tape inserting operation. This enables the operator to notice that he or she inserted the tape into the wrong feeder.

The setup supporting device may be configured so that the controller notifies the feeder indicated as the object of the tape inserting operation by the operation object information to an operator when confirming based on the operation object information that the one feeder is not the object of the tape inserting operation. This enables the operator to easily grasp the feeder into which the tape should be inserted.

Incidentally, various specific methods to specify the feeder serving as the object of the tape inserting operation are conceivable. For example, the setup supporting device may be configured to comprise a reader that reads a feeder identification code assigned to the feeder, wherein the controller generates the operation object information indicating that the feeder corresponding to the feeder identification code read by the reader is the object of the tape inserting operation and stores the generated operation object information in the storage.

Further, in causing one feeder to perform the loading or the standby, a further condition may be imposed besides the condition that the one feeder could be confirmed to be the object of the tape inserting operation.

Therefore, the setup supporting device may be configured so that the controller causes the one feeder to perform the loading or the standby when the one feeder is confirmed to be the object of the tape inserting operation based on the operation object information and a combination of the tape inserted into the one feeder and the one feeder is proper. In such a configuration, it is required in causing the one feeder to perform the loading or the standby not only that the one feeder having detected the tape is the object of the tape inserting operation, but also that the combination of the tape and the one feeder is proper. Thus, the tape in a proper combination with the feeder can be attached to the feeder.

Further, the setup supporting device may be configured so that the controller notifies a warning to an operator when confirming that the combination of the tape inserted into the one feeder and the one feeder is not proper. This enables the operator to notice that the tape in a wrong combination was inserted into the feeder.

Incidentally, various specific configurations to specify the combination of the tape and the feeder are conceivable. For example, the setup supporting device may be configured so that the controller judges based on a comparison result of a component identification code to identify the components housed in the tape and a feeder identification code assigned to the feeder whether or not the combination of the tape inserted into the one feeder and the one feeder is proper.

The setup supporting device may be configured so that the controller causes the one feeder to perform the loading or the standby when the one feeder is confirmed to be the object of the tape inserting operation based on the operation object information and a mount position of the one feeder with respect to a predetermined feeder supporting member is proper. In such a configuration, it is required in causing the feeder to perform the loading or the standby not only that the feeder having detected the tape is the object of the tape inserting operation, but also that the mount position of the one feeder with respect to the feeder supporting member is proper. Thus, the feeder can be mounted at the proper mount position.

Further, the setup supporting device may be configured so that the controller notifies a warning to an operator when confirming that the mount position of the one feeder with respect to the predetermined feeder supporting member is not proper. This enables the operator to notice that the feeder was mounted at the wrong mount position.

Incidentally, various specific configurations to detect the tape inserted into the tape inserting part are conceivable. For example, the setup supporting device may be configured so that the carrier includes a rotary member configured to be engaged with the tape inserted into the tape inserting part and rotate as the tape is conveyed in the loading; and the detector detects the tape inserted into the tape inserting part based on a torque generated on the rotary member by being pressed by the tape inserted into the tape inserting part. The setup supporting device may be configured so that the detector detects the tape inserted into the tape inserting part based on a switch or an optical sensor whose state is switched according to the insertion of the tape into the tape inserting part.

What is claimed is:

1. A setup supporting device, comprising:
   a storage that stores operation object information indicating a feeder serving as an object of a tape inserting operation of inserting tape housing components out of a plurality of feeders;
   a controller that judges whether or not the tape inserting operation performed for the feeder is proper; and
   a reader that reads a feeder identification code assigned to the feeder,
   wherein:
   the feeder includes a tape inserting part into which the tape is to be inserted, a component supply part to supply the components housed in the tape, a carrier that performs loading by a sprocket that engages with the tape inserted into the tape inserting part to draw the tape inserted into the tape inserting part up to a predetermined position toward the component supply part, and a detector that faces a tape insertion path between the tape inserting part and the sprocket and detects a presence or absence of the tape inserted into the tape inserting part;
   after detecting a presence of the tape inserted into the feeder, the controller judges whether a combination of the tape and one feeder having detected the tape inserted into the tape inserting part, out of the plurality of feeders, is proper before performing loading or standby of the tape and, upon determining that the combination of the tape and the one feeder is proper, causes the one feeder to perform the loading or the standby to cause the tape to temporarily wait before the loading when confirming based on the operation object information that the one feeder is the object of the tape inserting operation;
   the controller generates the operation object information indicating that the feeder corresponding to the feeder identification code read by the reader is the object of the tape inserting operation and stores the generated operation object information in the storage;
   the controller notifies a warning to an operator when confirming that the combination of the tape inserted into the one feeder and the one feeder is not proper; and
   the controller causes the one feeder to perform the loading or the standby when the one feeder is confirmed to be the object of the tape inserting operation based on the operation object information and a mount position of the one feeder with respect to a predetermined feeder supporting member is proper by judging whether a mount position corresponding to a combination of a component identification code to identify the components and the feeder identification code in the operation object information matches a mount position to which a feeder having detected the tape inserted is mounted.

2. The setup supporting device according to claim 1, wherein the controller notifies a warning to an operator when confirming based on the operation object information that the one feeder is not the object of the tape inserting operation.

3. The setup supporting device according to claim 1, wherein the controller notifies the feeder indicated as the object of the tape inserting operation by the operation object information to an operator when confirming based on the operation object information that the one feeder is not the object of the tape inserting operation.

4. The setup supporting device according to claim 1, wherein the controller judges based on a comparison result of a component identification code to identify the components housed in the tape and a feeder identification code assigned to the feeder whether or not the combination of the tape inserted into the one feeder and the one feeder is proper.

5. The setup supporting device according to claim 1, wherein the controller notifies a warning to an operator when confirming that the mount position of the one feeder with respect to the predetermined feeder supporting member is not proper.

6. The setup supporting device according to claim 1, wherein the detector detects the tape inserted into the tape inserting part based on a switch or an optical sensor whose state is switched according to the insertion of the tape into the tape inserting part.

7. A component mounter, comprising:
   a storage that stores operation object information indicating a feeder serving as an object of a tape inserting operation of inserting tape housing components out of a plurality of feeders;
   a controller that judges whether or not the tape inserting operation performed for the feeder is proper; and
   a reader that reads a feeder identification code assigned to the feeder, wherein:

the feeder includes a tape inserting part into which the tape is to be inserted, a component supply part to supply the components housed in the tape, a carrier that performs loading by a sprocket that engages with the tape inserted into the tape inserting part to draw the tape inserted into the tape inserting part up to a predetermined position toward the component supply part, and a detector that faces a tape insertion path between the tape inserting part and the sprocket and detects a presence or absence of the tape inserted into the tape inserting part;

after detecting a presence of the tape inserted into the feeder, the controller judges whether a combination of the tape and one feeder having detected the tape inserted into the tape inserting part, out of the plurality of feeders, is proper before performing loading or standby of the tape and, upon determining that the combination of the tape and the one feeder is proper, causes the one feeder to perform the loading or the standby to cause the tape to temporarily wait before the loading when confirming based on the operation object information that the one feeder is the object of the tape inserting operation;

the controller generates the operation object information indicating that the feeder corresponding to the feeder identification code read by the reader is the object of the tape inserting operation and stores the generated operation object information in the storage;

the controller notifies a warning to an operator when confirming that the combination of the tape inserted into the one feeder and the one feeder is not proper; and the controller causes the one feeder to perform the loading or the standby when the one feeder is confirmed to be the object of the tape inserting operation based on the operation object information and a mount position of the one feeder with respect to a predetermined feeder supporting member is proper by judging whether a mount position corresponding to a combination of a component identification code to identify the components and the feeder identification code in the operation object information matches a mount position to which a feeder having detected the tape inserted is mounted.

8. A setup supporting method, comprising:

confirming a feeder having detected a tape inserted into a tape inserting part out of a plurality of feeders each including the tape inserting part into which tape housing components are to be inserted and a component supply part to supply the components housed in the tape, the feeder including a carrier that performs loading by a sprocket that engages with the tape inserted into the tape inserting part to draw the tape inserted into the tape inserting part up to a predetermined position toward the component supply part, and a detector that faces a tape insertion path between the tape inserting part and the sprocket and detects a presence or absence of the tape inserted into the tape inserting part;

after detecting a presence of the tape inserted into the feeder, judging based on operation object information indicating the feeder serving as an object of a tape inserting operation of inserting the tape whether a combination of the tape and the feeder having detected the tape inserted into the tape inserting part is proper before performing loading or standby of the tape and, upon determining that the combination of the tape and the feeder is proper, causing the feeder to perform the loading or the standby to cause the tape to temporarily wait before the loading when confirming based on the operation object information that the feeder is the object of the tape inserting operation, reading a feeder identification code assigned to the feeder;

generating the operation object information indicating that the feeder corresponding to the feeder identification code read by the reading is the object of the tape inserting operation and stores the generated operation object information in the storage;

notifying a warning to an operator when confirming that the combination of the tape inserted into the feeder and the feeder is not proper; and causing the feeder to perform the loading or the standby when the feeder is confirmed to be the object of the tape inserting operation based on the operation object information and a mount position of the feeder with respect to a predetermined feeder supporting member is proper by judging whether a mount position corresponding to a combination of a component identification code to identify the components and the feeder identification code in the operation object information matches a mount position to which a feeder having detected the tape inserted is mounted.

* * * * *